(12) United States Patent
Mulfinger et al.

(10) Patent No.: US 8,282,290 B2
(45) Date of Patent: Oct. 9, 2012

(54) CONNECTORS AND ASSEMBLIES HAVING A PLURALITY OF MOVEABLE MATING ARRAYS

(75) Inventors: Robert Neil Mulfinger, York Haven, PA (US); Richard Elof Hamner, Hummelstown, PA (US); Jason M'Cheyne Reisinger, Carlisle, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 39 days.

(21) Appl. No.: 12/686,484

(22) Filed: Jan. 13, 2010

(65) Prior Publication Data

US 2011/0170828 A1  Jul. 14, 2011

(51) Int. Cl.
*G02B 6/36* (2006.01)
*H01R 13/62* (2006.01)

(52) U.S. Cl. .................................. 385/53; 439/260
(58) Field of Classification Search .................. 385/53
See application file for complete search history.

(56) References Cited

U.S. PATENT DOCUMENTS

| | | |
|---|---|---|
| 4,085,990 A | 4/1978 | Jayne |
| 4,518,210 A | 5/1985 | Morrison |
| 4,603,928 A | 8/1986 | Evans |
| 4,626,056 A | 12/1986 | Andrews, Jr. et al. |
| 4,629,270 A | 12/1986 | Andrews, Jr. et al. |
| 4,731,698 A | 3/1988 | Millot et al. |
| 4,840,569 A | 6/1989 | Cabourne |
| 5,092,781 A | 3/1992 | Casciotti et al. |
| 5,102,342 A | 4/1992 | Marian |
| 5,171,154 A | 12/1992 | Casciotti et al. |
| 5,228,863 A | 7/1993 | Campbell et al. |
| 5,676,559 A * | 10/1997 | Laub et al. ............... 439/260 |
| 5,772,451 A | 6/1998 | Dozier, II et al. |
| 6,062,872 A | 5/2000 | Strange et al. |
| 6,077,090 A | 6/2000 | Campbell et al. |
| 6,411,517 B1 | 6/2002 | Babin |
| 6,672,878 B2 | 1/2004 | Dean |
| 6,945,788 B2 | 9/2005 | Trout et al. |
| 7,044,746 B2 | 5/2006 | Copper et al. |
| 7,114,961 B2 | 10/2006 | Williams |
| 7,297,015 B1 | 11/2007 | Desrosiers et al. |
| 7,374,441 B2 | 5/2008 | Rubenstein |
| 7,419,400 B1 | 9/2008 | Taylor et al. |
| 7,425,134 B1 | 9/2008 | Taylor |
| 7,438,582 B2 | 10/2008 | Taylor |
| 2007/0097662 A1 * | 5/2007 | Dean ......................... 361/801 |
| 2008/0227314 A1 | 9/2008 | Taylor |

OTHER PUBLICATIONS

Neoconix PCBearm™ Interposer Design Guide, Neoconix, Rev, 070925, 4 pgs.

* cited by examiner

*Primary Examiner* — Uyen Chau N Le
*Assistant Examiner* — Hoang Tran

(57) ABSTRACT

A connector configured to communicatively couple different components. The connector includes a base frame that extends along a longitudinal axis between a pair of frame ends and moveable first and second mating arrays comprising respective mating surfaces having terminals arranged thereon. The connector also includes a coupling mechanism supported by the base frame. The coupling mechanism holds the first and second mating arrays and moves the first and second mating arrays between retracted and engaged positions. The first and second mating arrays are spaced apart from a select component when in the corresponding retracted position. The first and second mating arrays are communicatively coupled to the select component when in the corresponding engaged position. The coupling mechanism initiates movement of the first mating array from the retracted position toward the engaged position while the second mating array remains stationary with respect to the base frame.

20 Claims, 13 Drawing Sheets

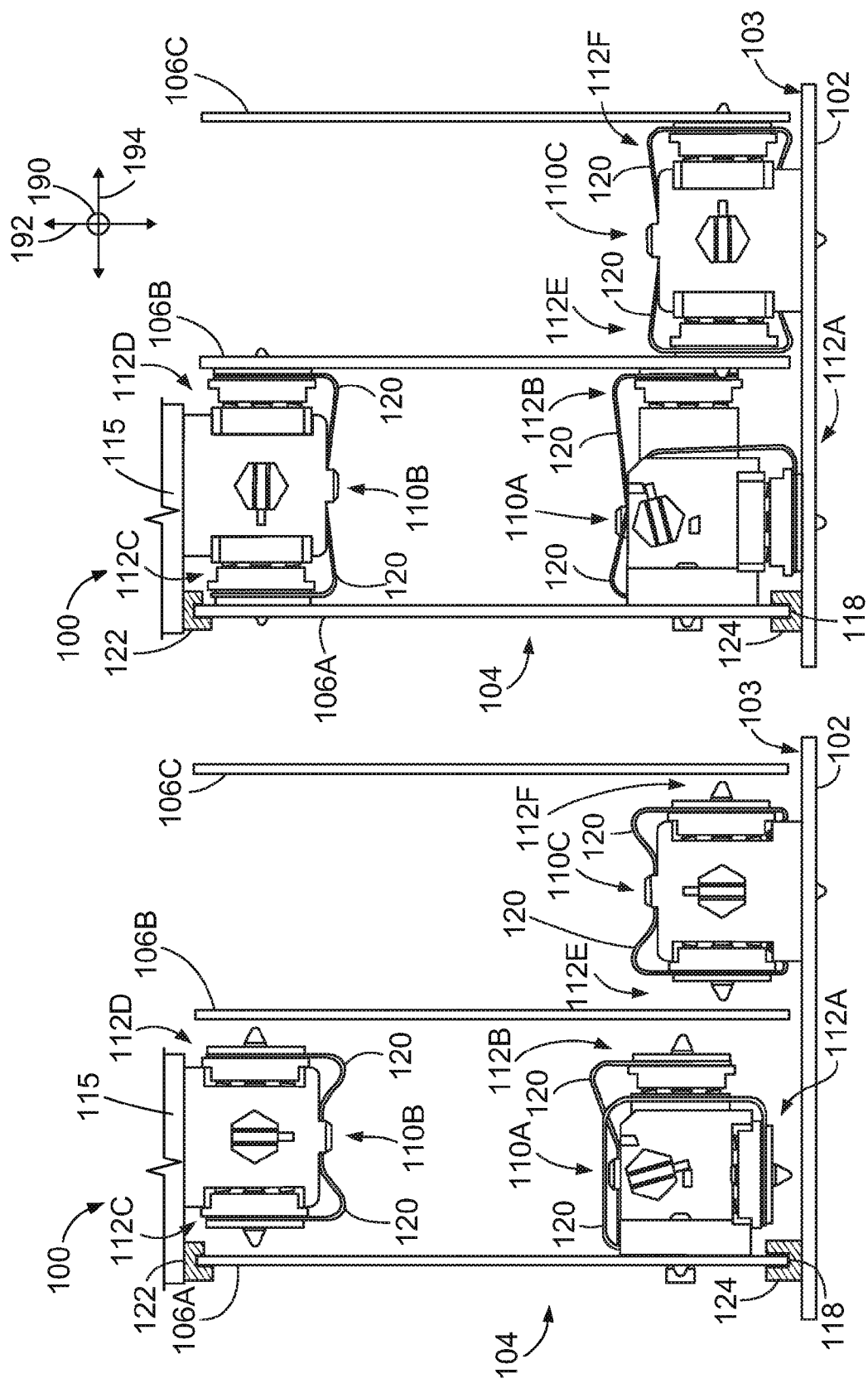

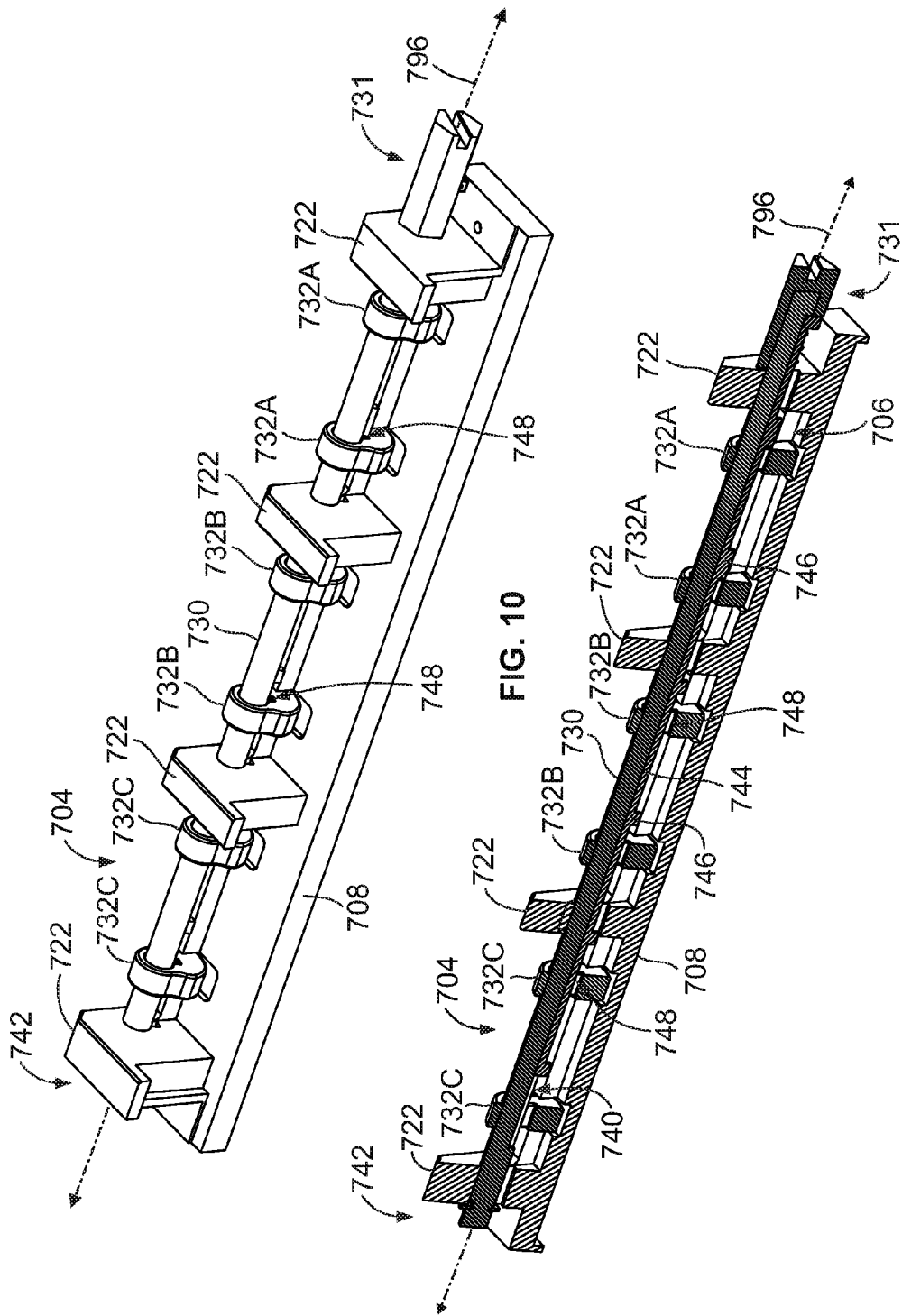

CONNECTORS AND ASSEMBLIES HAVING A PLURALITY OF MOVEABLE MATING ARRAYS

CROSS-REFERENCES TO RELATED APPLICATIONS

Subject matter described herein is similar to subject matter described in U.S. patent application Ser. No. 12/428,851, entitled "REMOVABLE CARD CONNECTOR ASSEMBLIES HAVING FLEXIBLE CIRCUITS," and U.S. patent application Ser. No. 12/428,806, entitled "CONNECTOR ASSEMBLIES AND SYSTEMS INCLUDING FLEXIBLE CIRCUITS," both of which were filed on Apr. 23, 2009, and similar to subject matter described in a U.S. patent application Ser. No. 12/686,518, entitled "CONNECTORS AND ASSEMBLIES HAVING A PLURALITY OF MOVEABLE MATING ARRAYS," filed contemporaneously herewith, all of which are incorporated by reference in the entirety.

BACKGROUND OF THE INVENTION

The subject matter herein relates generally to connectors, and more particularly, to connectors that are configured to communicatively couple different components.

Some systems, such as servers, routers, and data storage systems, utilize connector assemblies for transmitting signals and/or power through the system. Such connector assemblies typically include a backplane or a midplane circuit board, a motherboard, and a plurality of daughter cards. The connector assemblies also include one or more connectors that are attached to the circuit board(s) for interconnecting the daughter cards to the circuit board(s) when the daughter card is inserted into the system. Each daughter card includes a header or receptacle assembly having a mating face that is configured to connect to a mating face of the connector. The header/receptacle assembly is typically positioned on or near a leading edge of the daughter card. Prior to being mated, the mating faces of the header/receptacle assembly and the connector are aligned with each other and face each other along a mating axis. The daughter card is then moved in an insertion direction along the mating axis until the mating faces engage and mate with each other.

The conventional backplane and midplane connector assemblies provide for interconnecting the daughter cards to the backplane or midplane circuit board by moving the daughter card in an insertion direction which is the same as the mating direction. In some cases it may be desirable to mate the daughter card in a mating direction that is perpendicular to the insertion direction. However, when the header/receptacle assembly is on a surface of the daughter card and faces a direction perpendicular to the insertion direction (e.g., perpendicular to a surface of the daughter card) and the connector is on the backplane circuit board and also faces a direction perpendicular to the insertion direction, it may be difficult to properly align and mate the header/receptacle assembly and the connector.

Accordingly, there is a need for a connector that facilitates interconnection of a printed circuit (e.g., circuit board) to another component when the printed circuit and the component are oriented in an orthogonal relationship. Furthermore, there is also a need for alternative connectors that are capable of connecting daughter cards to backplane or midplane circuit boards of the subject systems. Furthermore, there is a general need for various connectors capable of establishing an electrical and/or optical connection between different components.

BRIEF DESCRIPTION OF THE INVENTION

In one embodiment, a connector configured to communicatively couple different components is provided. The connector includes a base frame that extends along a longitudinal axis between a pair of frame ends and moveable first and second mating arrays comprising respective mating surfaces having terminals arranged thereon. The connector also includes a coupling mechanism supported by the base frame. The coupling mechanism holds the first and second mating arrays and moves the first and second mating arrays between retracted and engaged positions. The first and second mating arrays are spaced apart from a select component when in the corresponding retracted position. The first and second mating arrays are communicatively coupled to the select component when in the corresponding engaged position. The coupling mechanism initiates movement of the first mating array from the retracted position toward the engaged position while the second mating array remains stationary with respect to the base frame.

In another embodiment, a connector configured to communicatively couple components is provided. The connector includes a base frame that extends along a longitudinal axis between a pair of frame ends and moveable first and second mating arrays that include respective mating surfaces having terminals arranged thereon. The connector also includes a coupling mechanism that is supported by the base frame. The coupling mechanism holds the first and second mating arrays and moves the first and second mating arrays between retracted and engaged positions. The first and second mating arrays are spaced apart from a select component when in the retracted position. The first and second mating arrays are communicatively coupled to the select component when in the engaged position. The connector also includes a keying device that is operatively connected to the coupling mechanism. The keying device selectively engages at least one of the first and second mating arrays, wherein said mating arrays that are selectively engaged to the keying device move between the retracted and engaged positions when the coupling mechanism is actuated.

In yet another embodiment, a connector configured to communicatively couple different components is provided. The connector includes a base frame that extends along a longitudinal axis between a pair of frame ends and moveable first and second mating arrays comprising respective mating surfaces having terminals arranged thereon. The connector also includes a coupling mechanism supported by the base frame. The coupling mechanism holds the first and second mating arrays and moves the first and second mating arrays between retracted and engaged positions. The first and second mating arrays are spaced apart from a select component when in the corresponding retracted position. The first and second mating arrays are communicatively coupled to the select component when in the corresponding engaged position. The coupling mechanism initiates movement of the first mating array from the retracted position toward the engaged position while the second mating array remains stationary with respect to the base frame. The connector also includes a keying device that is operatively connected to the coupling mechanism. The keying device selectively engages at least one of the first and second mating arrays, wherein said mating arrays that are selectively engaged to the keying device move between the retracted and engaged positions when the coupling mechanism is actuated.

BRIEF DESCRIPTION OF THE DRAWINGS

FIG. 1 is an end view of an electrical system using a plurality of electrical connectors formed in accordance with various embodiments.

FIG. 2 is the end view of the electrical system of FIG. 1 illustrating the electrical connectors engaged with printed circuits.

FIG. 10 is a perspective view of a coupling mechanism and a keying device that may be used with various embodiments.

FIG. 11 is a cross-sectional perspective view of the coupling mechanism and the keying device shown in FIG. 10.

DETAILED DESCRIPTION OF THE INVENTION

Figure 3:
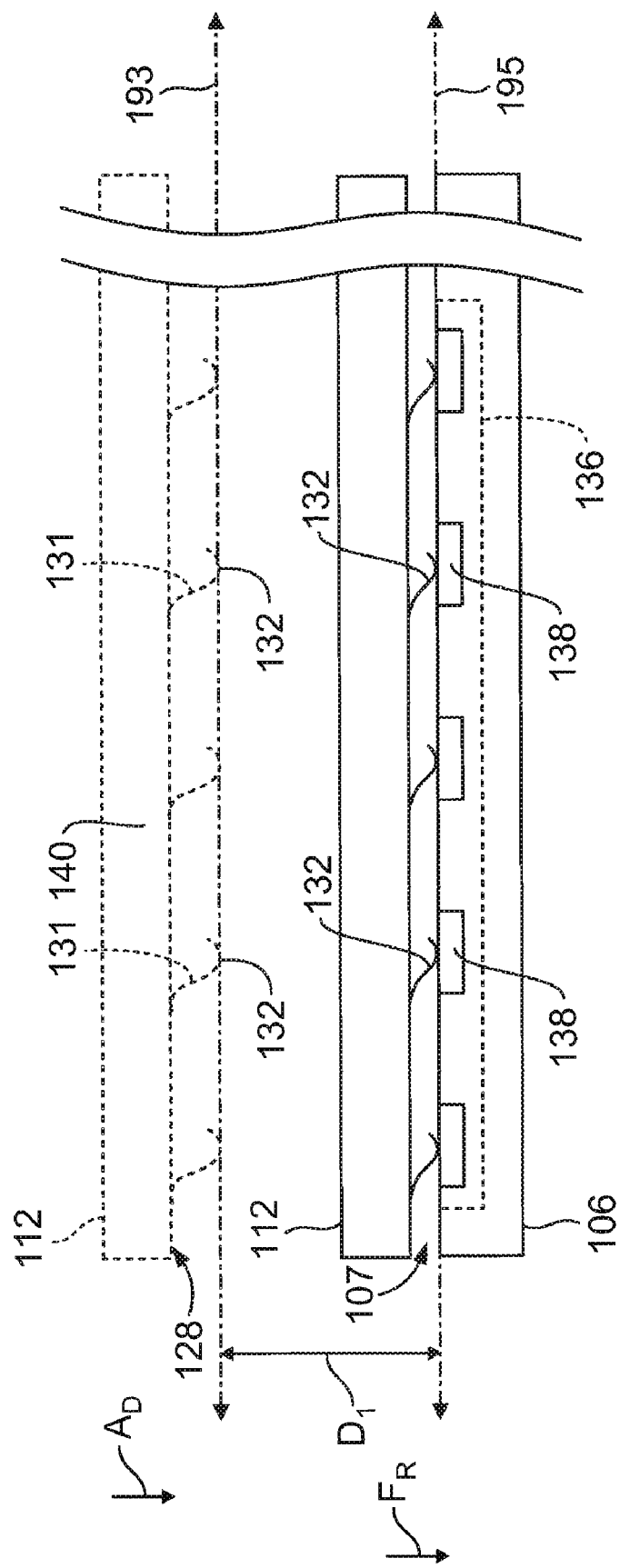
FIG. 3 is a cross-sectional view of a printed circuit and a moveable contact array that may be used with the electrical system shown in FIG. 1.

Embodiments described herein include connectors that are configured to establish at least one of an electrical and optical coupling (e.g., for transmitting data signals or power) between different components. The components that are interconnected by the connectors may be printed circuits (e.g., circuit boards or flex circuits), other connectors (e.g., optical and/or electrical connectors), or any other components that are capable of establishing an electrical or optical coupling to the connectors. The connectors include one or more moveable mating arrays that have terminals that are configured to couple to or engage with other terminals to establish the electrical and/or optical coupling. For example, the terminals may be mating contacts for establishing an electrical connection or optical fiber terminals for establishing an optical connection. Embodiments described herein also include coupling mechanisms that are configured to move the mating arrays from a retracted position, where the mating array is spaced apart from a select component, to an engaged position, where the mating array is engaged with the select component.

FIGS. 1 and 2 are end views of an electrical system 100 formed in accordance with one embodiment. Although the following is described with reference to an electrical system that includes electrical connectors, the following description may similarly apply to connectors that establish optical lines of communication. The electrical system 100 includes a printed circuit 102, which is illustrated as a motherboard in FIG. 1, a removable card assembly 104, a plurality of printed circuits 106 (also called daughter cards), and a plurality of electrical connectors 110 that interconnect the printed circuits 102 and 106 to each other in the electrical system 100. FIG. 1 illustrates the electrical system 100 in a disengaged state where the printed circuits 102 and 106 are not electrically interconnected, and FIG. 2 illustrates the electrical system 100 in an engaged state where the electrical connectors 110 electrically interconnect the printed circuits 102 and 106 to each other. To move from the disengaged state to the engaged state, various embodiments described herein include electrical connectors with moveable contact arrays. The contact arrays are moved by one or more coupling mechanisms between retracted and engaged positions. The electrical system 100 may be, for example, a server system. However, the electrical system 100 shown in FIG. 1 may be a variety of other electrical systems, such as a router system or a data storage system.

Figure 14:
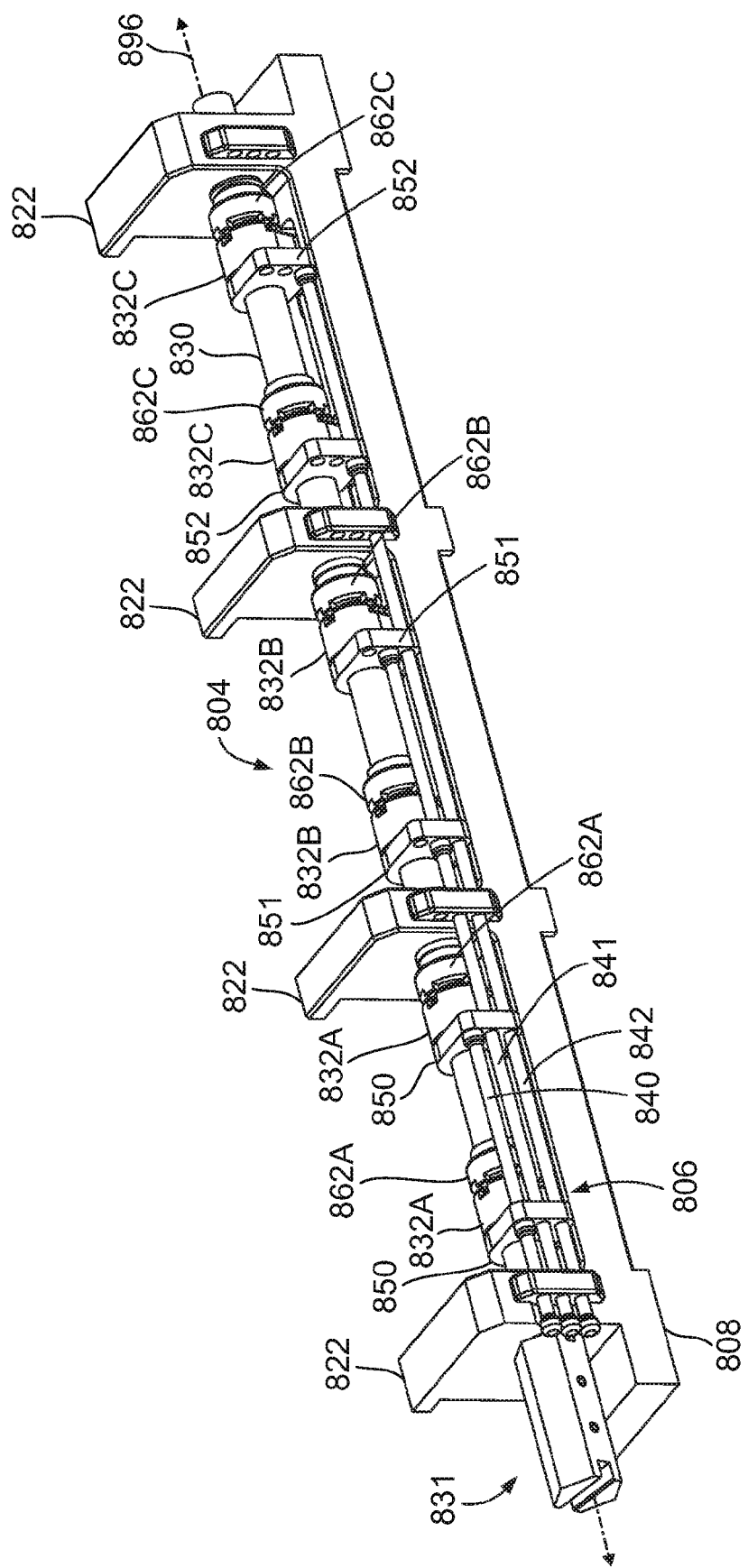
FIG. 14 illustrates a perspective view of a coupling mechanism and a keying device that may be used with other embodiments.

Furthermore, although not shown in FIGS. 1 and 2, the electrical connectors 110 may include keying devices, such as the keying devices 706 (shown in FIG. 11) and 806 (shown in FIG. 14). The keying devices may facilitate moving only select contact arrays between the retracted and engaged positions.

As used herein, the term "mating array" includes a plurality of terminals arranged in a predetermined configuration. For example, the mating array may be a contact array having mating contacts configured to establish an electrical connection, or the mating array may be an optical terminal array having optical terminals configured to establish an optical connection. In some embodiments, the mating array may include both mating contacts and optical terminals.

As used herein, the term "contact array" includes a plurality of mating contacts arranged in a predetermined configuration and held together by a common base material or structure, such as a dielectric substrate. A contact array may include or be a component of a printed circuit. A variety of mating contacts may be used in the contact arrays, including contacts that are stamped and formed, etched and formed, solder balls, pads, press-fit contacts, and the like. In some embodiments, the mating contacts form a planar array (i.e., the mating contacts are arranged substantially co-planar with respect to each other). In some embodiments, the contact array may have multiple sub-arrays of mating contacts. Optical terminal arrays may have similar configurations and features as described with respect to the contact arrays.

As used herein, a "removable card assembly" includes a connector assembly having at least one connector as described herein. A card assembly may be inserted into a system so that the connector has a predetermined orientation and position with respect to a component. The connector may then be removably coupled to the component of the system, such as a motherboard, daughter card, or another component. A card assembly may be sized and shaped so that the card assembly may be carried and inserted/removed by an operator or a machine. Furthermore, a card assembly may have sufficient structure to withstand repeated insertions and removals from a corresponding system without damaging the card assembly. As used herein, "removably coupled" means that two coupled parts or components may be readily separated from and coupled (electrically, optically, or mechanically) to each other without destroying or damaging either of the two.

The term "printed circuit," as used herein, includes any electric circuit in which the conducting connections have been printed or otherwise deposited in predetermined patterns on an insulating base or substrate. For example, a printed circuit may be a circuit board, an interposer made with printed circuit board material, a flexible circuit having embedded conductors, a substrate having one or more layers of flexible circuit therealong, and the like. The printed circuit may have mating contacts arranged thereon.

A "flex connection," as used herein, is an arrangement of flexible communication pathways that communicatively connect two or more components. A flex connection includes at least one of an electrical conductor and a fiber optic communication line and may be used to interconnect different mating arrays of the connectors described herein. Flex connections may provide pathways for data and/or power transmission in which current or light is transmitted. For example, a flex connection may be a flexible circuit configured to convey a current through conductors (e.g., conductive traces) embedded within a flexible substrate. Such a flexible circuit may transmit data and/or power between first and second components, which may include printed circuits and/or contact arrays. Furthermore, a flex connection may include one or more fiber optic cables having optical waveguides that transmit light, for example, by total internal reflection. The optical waveguides may include a flexible cladding. The fiber optic cables may be configured to have a limited bend radius so that optical waveguides may transmit light through total internal reflection.

A "flexible circuit" (also called flex circuit), as used herein, is a printed circuit having an arrangement of conductors embedded within or between flexible insulating material(s). For example, flexible circuit(s) may be configured to convey an electrical current between first and second electrical components, such as printed circuits or, more specifically, circuit boards and contact arrays.

An "interposer," as used herein, includes a planar body having opposite sides with corresponding mating contacts and a plurality of conductive pathways extending therebetween to connect the mating contacts. An interposer may be a circuit board where mating contacts are etched and formed along two opposing sides of a circuit board. The circuit board may have conductive pathways coupling each mating contact to a corresponding mating contact on the other side. However, in other embodiments, the interposer might not be a circuit board or another printed circuit. For example, an interposer may include a carrier having a planar body with a plurality of holes extending therethrough. Stamped and formed mating contacts may be arranged by the carrier such that each mating contact is positioned within a corresponding hole. The mating contacts may interface with one circuit board on one side of the carrier and have ball contacts that are soldered to another circuit board on the other side of the carrier. An interposer may also take other forms.

As used herein, "communicatively" coupling or connecting includes transmitting current or light between two components. For example, power or data signals may be transmitted between two components that are communicatively coupled.

Returning to FIGS. 1 and 2, the printed circuits 102 and 106 may be in fixed positions with respect to each other when the printed circuits 102 and 106 are electrically interconnected. In each example shown in FIGS. 1 and 2, the electrical connectors 110A-C extend along a longitudinal direction or axis 190 that extends into the page and the printed circuits 102 and 106 extend along planes that are parallel to the longitudinal axis 190. The printed circuits 102 and 106 may be oriented such that the printed circuits 102 and 106 are substantially orthogonal or are substantially parallel to one another. For example, the printed circuit 102 may extend along a lateral plane defined by the longitudinal axis 190 and the lateral axis 194, and the printed circuits 106 may extend along a vertical plane defined by the longitudinal axis 190 and the vertical axis 192. In some embodiments, the printed circuits 102 and 106 may be substantially orthogonal (or perpendicular) to one another (e.g., 90°+/−20°). The printed circuits 102 and 106 may also form other angles or some other positional relationship with respect to each other. For example, the printed circuits 102 and 106 may be oblique to one another. Also shown, the printed circuits 106A-C may be substantially parallel to one another.

The electrical connectors 110A-C illustrate various types or kinds of connectors that may be formed in accordance with embodiments described herein. The electrical connectors 110 are used to interconnect at least two electrical components. For example, the electrical connector 110A may be part of the removable card assembly 104, and the electrical connector 110C may be mounted (e.g., fastened or secured) to the printed circuit 102 for electrically interconnecting the printed circuit 102 to the printed circuits 106B and 106C. Furthermore, the electrical connector 110B may be mounted to a chassis or structural support 115 of the electrical system 100 and be used to electrically interconnect the printed circuits 106A and 106B. In alternative embodiments, the electrical connectors 110A-C may directly connect to one another. As shown, the electrical connectors 110A-C may use flexible circuits 120 to move contact arrays 112A-F between corresponding retracted positions (shown FIG. 1) and corresponding engaged positions (shown in FIG. 2). The movement may be in a linear manner along the vertical or lateral axes 192 and 194.

The removable card assembly 104 may include the printed circuit 106A, which is illustrated as a circuit board, and the electrical connector 110A. Although not shown, the removable card assembly 104 may include other components, such as a housing, sidewalls, a handle, or any other structural components that facilitate shielding the removable card assembly 104 or that facilitate inserting/removing the removable card assembly 104. To insert the removable card assembly 104 into the electrical system 100, the removable card assembly 104 may be advanced into the electrical system 100 in the longitudinal direction such that an edge 118 of the printed circuit 106A moves alongside a surface 103 of the printed circuit 102. The removable card assembly 104 may engage guiding features 122 and 124, which are illustrated as rails in FIGS. 1 and 2, and slide to a predetermined position and orientation with respect to the printed circuits 102 and 106B. Once the removable card assembly 104 is properly positioned, the contact array 112A may be moved to engage the printed circuit 102 and the contact array 112B may be moved to engage the printed circuit 106B. The printed circuits 106A, 106B, and 102 may be electrically coupled to one another through the electrical connector 110A and, more specifically, through the contact arrays 112A and 112B and corresponding flexible circuits 120.

Likewise, the electrical connectors 110B and 110C may be actuated to move the corresponding contact arrays 112C, 112D and 112E, 112F, respectively, away from each other in opposite directions. The electrical connector 110B may electrically interconnect the printed circuits 106A and 106B directly to each other through the flexible circuits 120. The electrical connector 110C may electrically interconnect the printed circuits 102, 106B, and 106C to each other.

In alternative embodiments, contact arrays from different electrical connectors may electrically connect directly to each other. For example, the contact arrays 112B and 112E of the electrical connectors 110A and 110C, respectively, may be configured to directly connect with each other. More specifically, if the printed circuit 106B were removed, the contact arrays 112B and 112E could move to and from each other to directly engage each other.

As described above, in alternative embodiments, the connectors 110 may be configured to establish optical communications lines. For example, the printed circuits 102 and 106 may be other components that are capable of being electrically and/or optically coupled to the connectors 110. The contact arrays 112 may be mating arrays 112 having optical terminals and the flexible circuits 120 may be other flex connections, such as fiber optic cables 112.

FIG. 3 is a cross-sectional view of an exemplary contact array 112 in a retracted position (shown in dashed lines) and in an engaged position (solid lines) with respect to an exemplary printed circuit 106. The contact array 112 includes a substrate 140 having a mating surface 128 with mating contacts 132 arranged thereon. The mating surface 128 may face a mating direction (indicated by an arrow $A_D$). In some embodiments, the contact array 112 may be moved bi-directionally in a linear manner (i.e., axially) between the retracted and engaged positions. The printed circuit 106 may have a contact array 136 of mating contacts 138 that are configured to engage corresponding mating contacts 132 of the contact array 112. As shown, in the retracted position, the mating contacts 132 of the contact array 112 are spaced apart (i.e., spaced a distance $D_1$ away) from corresponding mating contacts 138 of the printed circuit 106. In the engaged position, each mating contact 132 makes sufficient contact with one of the mating contacts 138 to electrically couple the two together. As shown, the mating surface 128 of the contact array 112 may extend adjacent to and substantially parallel to a circuit surface 107 (i.e., the mating and circuit surfaces 128 and 107 face each other). As will be discussed further below, the contact array 112 may be held and moved toward the printed circuit 106 until the corresponding mating contacts 132 and 138 are engaged. As such, the contact array 112 may be removably coupled to or engaged with the printed circuit 106.

In the illustrated embodiment, the mating surface 128 and the circuit surface 107 are planar surfaces and extend substantially parallel to one other while in the retracted and engaged positions and in any position therebetween. The mating contacts 132 of the contact array 112 may be co-planar with respect to each other and arranged along a contact plane 193 that extends substantially parallel to a circuit plane 195 formed by the circuit surface 107 and/or the mating contacts 138. Each mating contact 132 may be aligned with the corresponding mating contact 138 before engaging each other, but spaced apart from the corresponding mating contact 138 by substantially the same distance $D_1$. When the contact array 112 is moved toward the printed circuit 106 in a linear manner along the mating direction $A_D$, the distance $D_1$ decreases until the corresponding mating contacts 132 and 138 are engaged.

In alternative embodiments, the contact array 112 may be moved toward and engage the printed circuit 106 in other manners. For example, the circuit surface 107 and the mating surface 128 may not be parallel when in the retracted position, but may become aligned and parallel with each other when the contact array 112 is in the engaged position. The contact array 112 may pivot about an edge of the contact array from the retracted position to the engaged position.

In the illustrated embodiment, the mating contacts 132 include resilient beams 131 that flex to and from the mating surface 128. The resilient beams 131 resist deflection and exert a resistance force $F_R$ in a direction away from the mating surface 128. In some embodiments, the resilient beams 131 may compensate for slight misalignment or misorientation between the contact array 112 of mating contacts 132 and the contact array 136 of mating contacts 138 when the contact array 112 is moved into the engaged position. In alternative embodiments, the resilient beams 131 of the mating contacts 132 may be bifurcated or the mating contacts 132 may include two separate beams that project toward each other or in opposite directions. Such dual-beam mating contacts 132 may be configured to engage only one corresponding mating contact 138.

In FIG. 3, the mating contacts 138 of the printed circuit 106 are pads that are flush with the circuit surface 107 and the mating contacts 132 of the contact array 112 include resilient beams 131 that project from the mating surface 128. However, the mating contacts 138 and 132 may have other forms and are not intended to be limited to such configurations. For example, in alternative embodiments, the mating contacts 138 may include resilient beams that project from the circuit surface 107 and/or the mating contacts 132 may be flush with the mating surface 128 of the contact array 112. Furthermore, the mating contacts 138 and the mating contacts 132 may both be pads configured to engage each other. Also, in alternative embodiments, the mating contacts 132 or 138 may be rounded protrusions or pads that project away from the corresponding surface.

In alternative embodiments, the mating contacts 138 and 132 may be optical terminals that connect with each other to establish an optical communication line.

Figure 4:
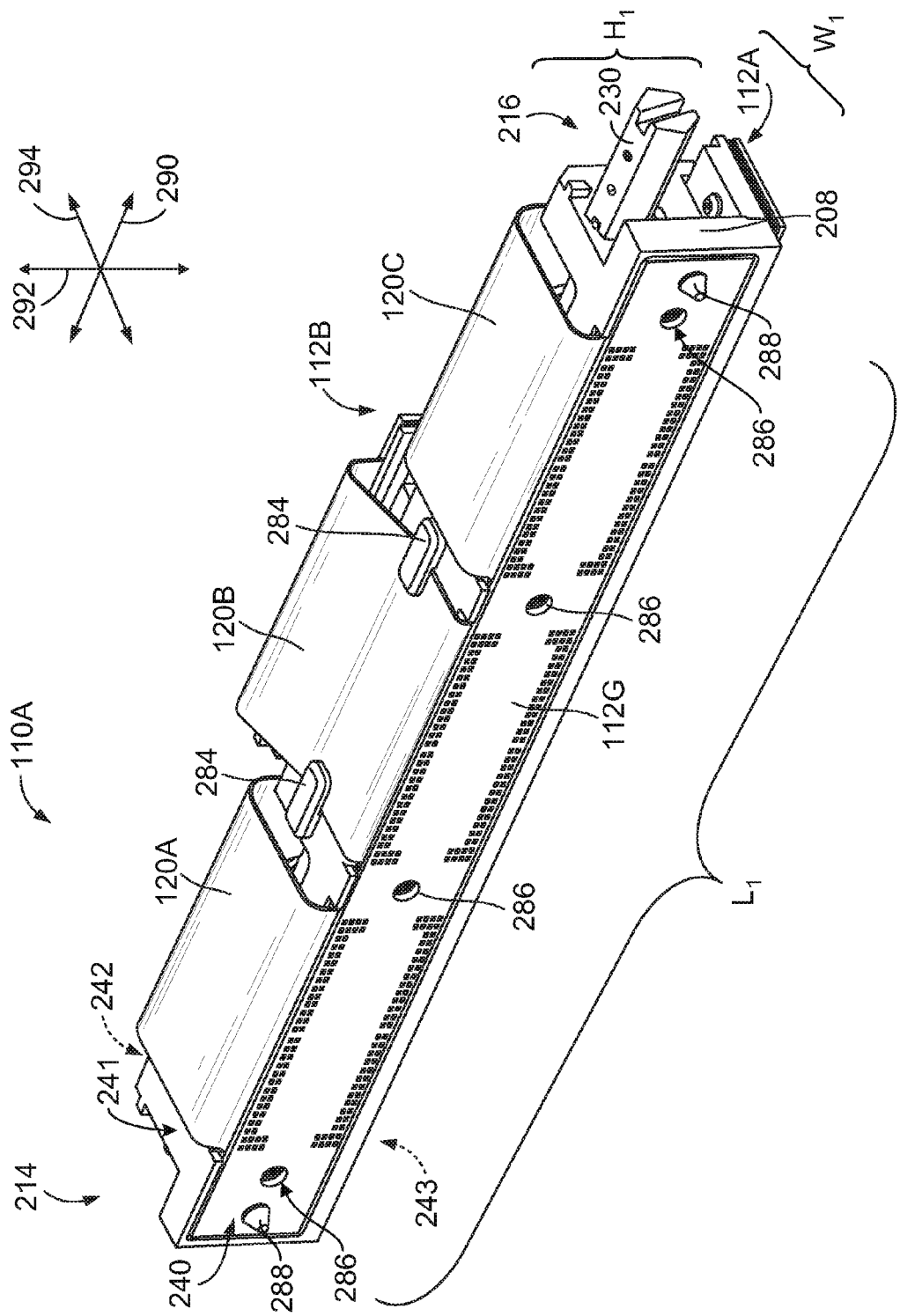
FIG. 4 is a perspective view of an electrical connector formed in accordance with one embodiment.
Figure 5:
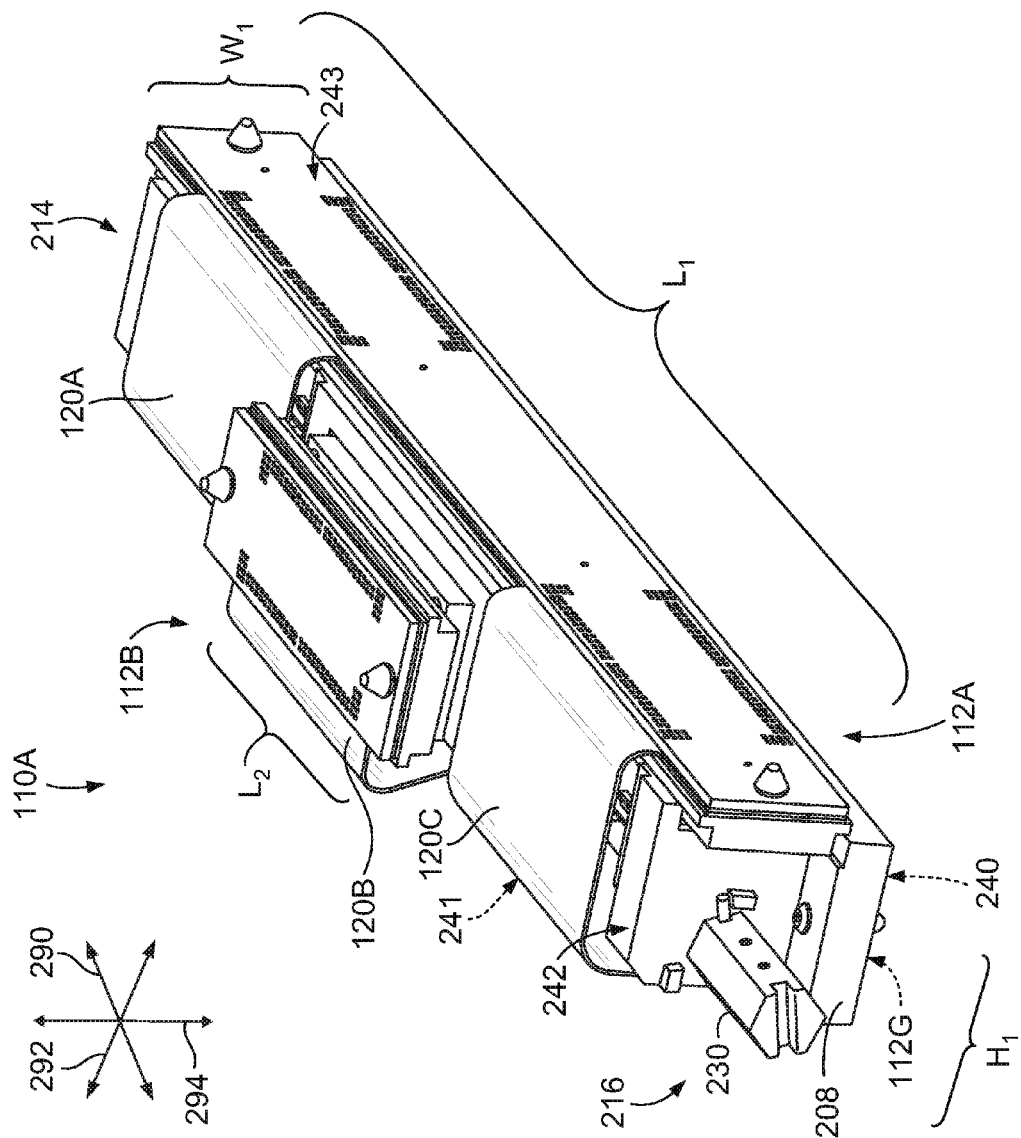
FIG. 5 is another perspective view of the electrical connector of FIG. 4.

FIGS. 4 and 5 are isolated perspective views of the electrical connector 110A, which is configured to be mounted to the printed circuit 106A (FIG. 1) and removably couple to printed circuits 102 and 106B (FIG. 1) through contact arrays 112A and 112B, respectively. As shown, the electrical connector 110A is oriented with respect to a longitudinal axis 290, a vertical axis 292, and a lateral axis 294. (In FIG. 5, the electrical connector 110A is rotated 90° counter-clockwise about the longitudinal axis 290 with respect to the electrical connector 110A in FIG. 4.) The electrical connector 110A has a substantially rectangular shape that includes a width $W_1$ that extends along the lateral axis 294, a length $L_1$ that extends along the longitudinal axis 290, and a height $H_1$ that extends along the vertical axis 292. The electrical connector 110A may include a base frame 208 that extends lengthwise along the longitudinal axis 290 between frame ends 214 and 216. The base frame 208 may support a coupling mechanism 204 (shown in FIG. 6) that includes a rotatable axle 230 that extends substantially parallel to the longitudinal axis 290. As will be described in greater detail below, the coupling mechanism 204 may be operated by an individual or machine for moving the contact arrays 112A and 112B between the retracted and engaged positions. The contact arrays 112A and 112B are in retracted positions in FIGS. 4 and 5.

The electrical connector 110A may have sides 240-243 that extend between the frame ends 214 and 216. As shown, the electrical connector 110A has a square- or rectangular-shaped cross-section such that the sides 240-243 are either oriented parallel to one another or orthogonal (i.e., perpendicular) to one another. However, in alternative embodiments, the electrical connector 110A may have a cross-section with other geometric shapes, such as a triangle, pentagon, and the like, where one or more sides may have a contact array thereon.

The side 240 is configured to interface with the printed circuit 106A when the base frame 208 is mounted thereon. When the base frame 208 is mounted to the printed circuit 106A and the removable card assembly 104 (FIG. 1) is fully inserted into the electrical system 100 (FIG. 1), the base frame 208 may have a fixed relationship with respect to the printed circuits 102 and 106B. The sides 240-243 may have one or more contact arrays thereon. For example, the side 240 may have a stationary or fixed contact array 112G (FIG. 4) coupled thereto that extends along substantially the entire length $L_1$ of the electrical connector 110A. The contact array 112G and/or the side 240 may have alignment features 288 (FIG. 4) and/or fastening features 286 (FIG. 4) to facilitate mounting the base frame 208 to the printed circuit 106A and aligning mating contacts of the contact array 112G with corresponding mating contacts of the printed circuit 106A.

Also shown, the sides 242 and 243 may have the moveable contact arrays 112B and 112A, respectively, thereon. The coupling mechanism 204 is configured to hold the contact arrays 112A and 112B along their respective sides. The contact arrays 112A and 112B may be electrically coupled to each other and/or to the contact array 112G. As shown, the flexible circuits 120 electrically couple and directly attach (i.e., extend from one to the other) the contact arrays 112A, 112B, and 112G to each other. However, other circuitry may be used in addition to the flexible circuits 120.

Various configurations of contact arrays 112 and flexible circuits 120 may be used in embodiments of the electrical connector 110. For example, with specific reference to the electrical connector 110A, the contact arrays 112A and 112G extend along substantially the entire length $L_1$ of the electrical connector 110A, but the contact array 112B may extend along a length $L_2$ (FIG. 5) which is a portion of the length $L_1$. Furthermore, the contact array 112A is electrically coupled to the contact array 112G through two flexible circuits 120A and 120C, where the contact array 112B is located therebetween. The contact array 112B may have only one flexible circuit 120B that electrically couples the contact array 112B to the contact array 112G.

As shown, the flexible circuits 120A-C may be sized and shaped so that the contact arrays 112A and 112B may be moved as desired. Furthermore, the base frame 208 may include other components to control the flexing of the flexible circuits 120. For example, the base frame 208 may have clips 284 (FIG. 4) coupled thereto that are configured to hold a portion of the flexible circuit 120B proximate to the base frame 208. Although the flexible circuits 120 are illustrated as extending around the base frame 208 in the exemplary embodiment, the flexible circuits 120 may extend through the base frame 208. Each flexible circuit 120 may fold over itself in a predetermined manner.

Figure 6:
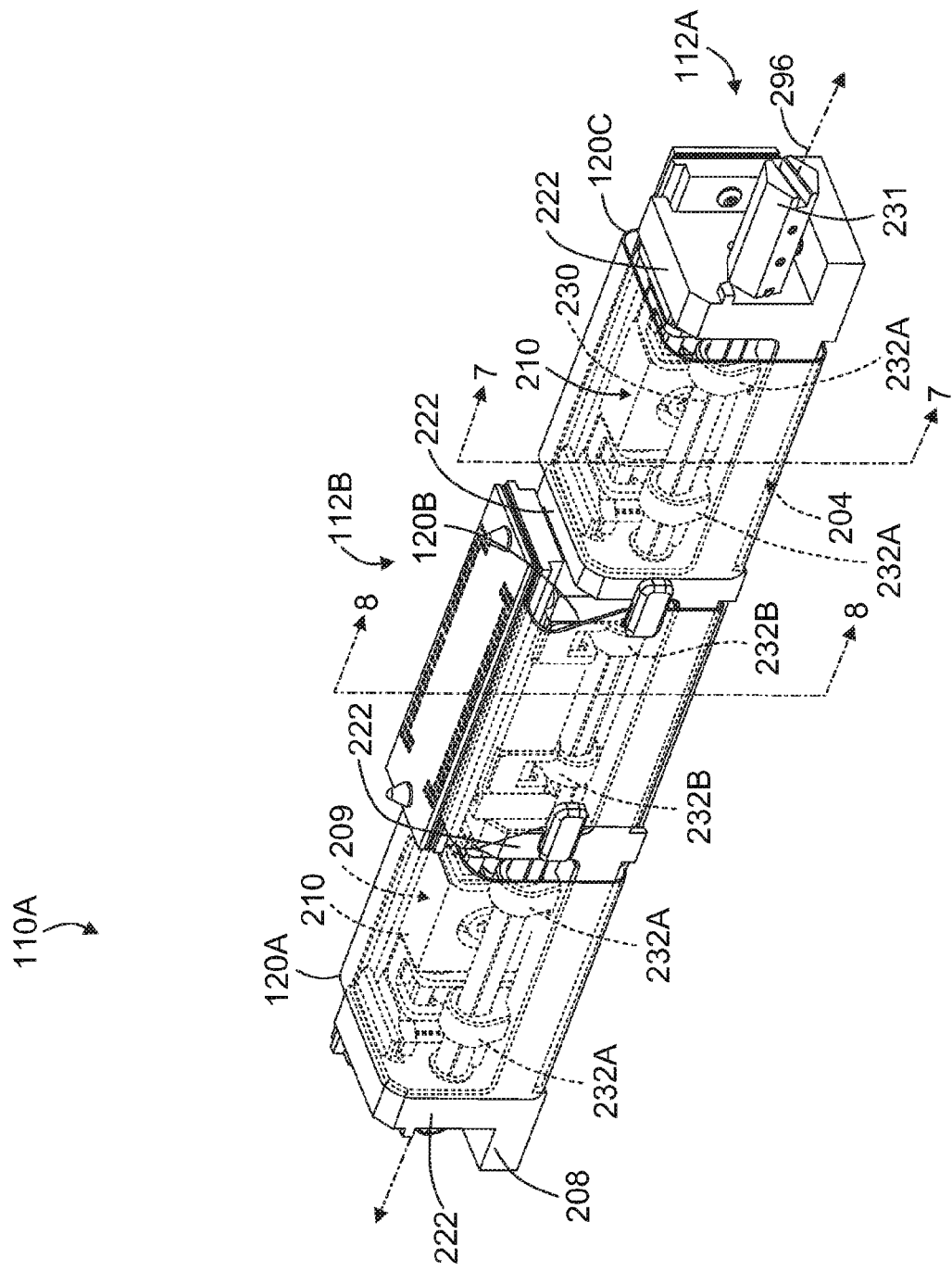
FIG. 6 is an exposed perspective view of the electrical connector of FIG. 4 showing internal components of the electrical connector.

FIG. 6 is another isolated perspective view of the electrical connector 110A where the flexible circuits 120 are illustrated by phantom lines so that internal components of the electrical connector 110A may be shown. In the illustrated embodiment, only a single coupling mechanism is used to move the contact arrays 112A and 112B. More specifically, when the coupling mechanism 204 is activated by an individual or machine, both contact arrays 112A and 112B are moved between the retracted and engaged positions. The contact arrays 112A and 112B may begin moving simultaneously or the contact arrays 112A and 112B may be moved according to a predetermined sequence so that one contact array electrically couples to a printed circuit before the other contact array(s). However, in alternative embodiments, more than one coupling mechanism may be used where each coupling mechanism may separately move one or more contact arrays.

The coupling mechanism 204 includes the axle 230 that extends along and rotates about a central axis 296. The coupling mechanism 204 also includes a plurality of cam fingers 232 coupled to the axle 230 and projecting radially away from the central axis 296. The coupling mechanism 204 may have a header 209 that includes multiple header sections 210. The axle 230 has an end 231 that is configured to be engaged by a user or system for rotating the axle 230 about the central axis 296. Furthermore, the base frame 208 includes a plurality of axle supports 222 that support the axle 230.

The coupling mechanism 204 includes only a single axle 230 with the cam fingers 232 projecting radially outward therefrom. However, in alternative embodiments, coupling mechanisms may include other mechanical components for moving the contact arrays. For example, alternative coupling mechanisms may include an additional axle(s) that is operatively coupled to the axle 230 through one or more gears. Coupling mechanisms may also use links, levers, sliding members, additional cams, shafts, and the like that interact with each other to move the contact arrays. Alternative coupling mechanisms that may be used with embodiments described herein may be similar to those described in U.S. patent application Ser. Nos. 12/428,806 and 12/428,851, which are incorporated by reference in the entirety.

Figure 7:
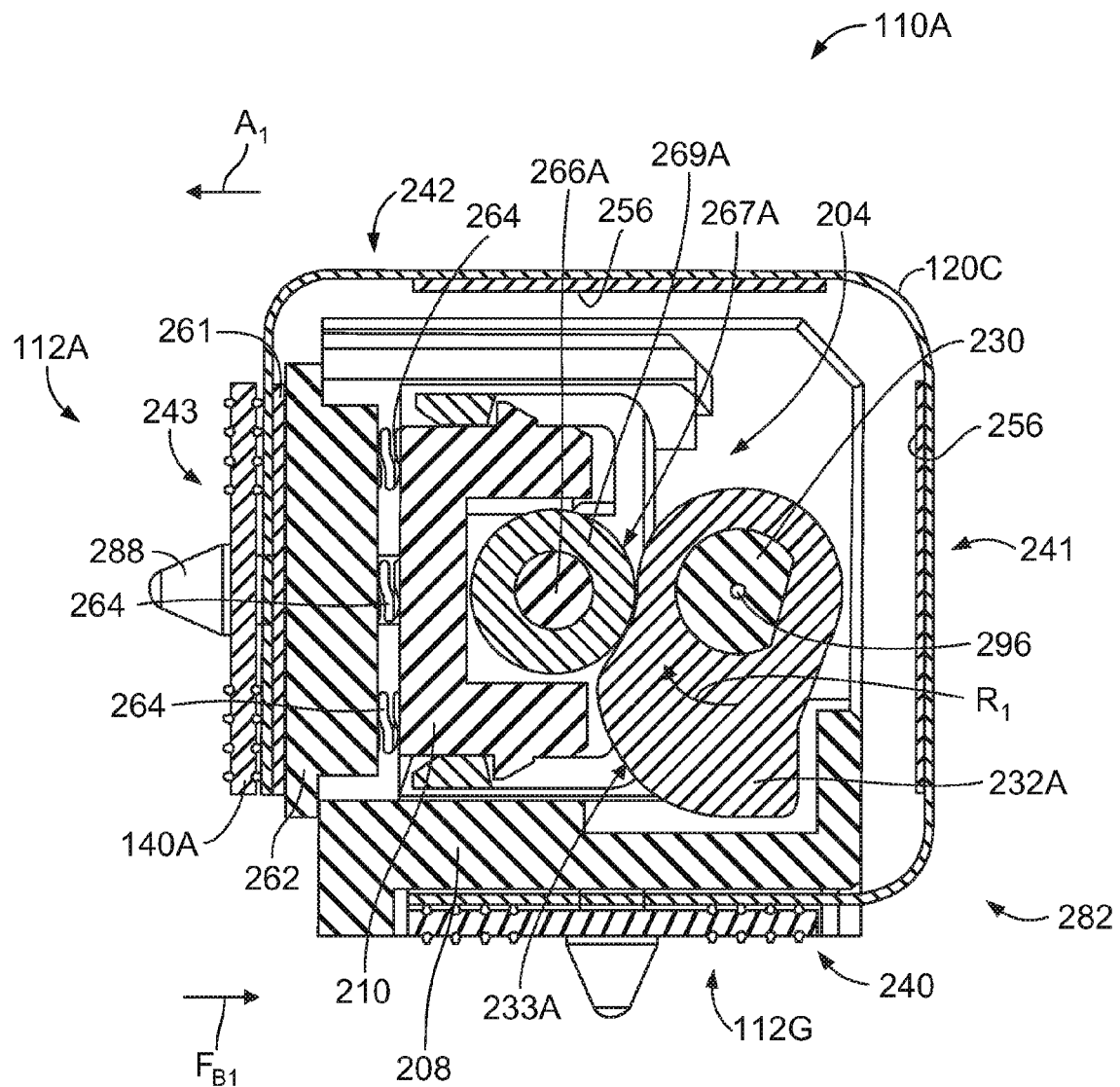
FIG. 7 is a cross-sectional view of the electrical connector taken along the line 7-7 in FIG. 6.

FIG. 7 is a cross-sectional view of the electrical connector 110A taken along the line 7-7 shown in FIG. 6. As shown, the flexible circuit 120C extends around the base frame 208 and the coupling mechanism 204 to electrically couple the contact array 112A on the side 243 to the contact array 112G on the side 240. The flexible circuit 120C may extend around a portion of a perimeter of the cross-section of the electrical connector 110A. The plurality of flexible circuits 120A-C (FIG. 5) and the contact arrays 112A (FIG. 6), 112B, and 112G may collectively form a circuit assembly 282 of the electrical connector 110A. The circuit assembly 282 includes conductive pathways through the flexible circuits 120A-C and contact arrays 112A, 112B, and 112G that are configured to interconnect different printed circuits as desired. For example, the circuit assembly 282 electrically interconnects the printed circuit 106B (e.g., a daughter card) and the printed circuit 102 (e.g., a motherboard) to each other and to the printed circuit 106A (e.g., a circuit board).

In alternative embodiments, the base frame 208 and the flexible circuits, such as 120C, may be configured such that the flexible circuit extends through the base frame 208.

As shown, the circuit assembly 282 may include rigid substrates or board stiffeners 256 for supporting and controlling a shape of the flexible circuit 120C. Each of the board stiffeners 256 may extend along a portion of the flexible circuit 120C at a predetermined area. The board stiffeners 256 may direct or control flexing of the flexible circuit 120C when the contact array 112A is moved between the retracted and engaged positions. The flexible circuit 120C may have a longer length than the perimeter defined by the sides 241 and 242 to allow the contact array 112A to be moved between the retracted and engaged positions. The length of the flexible circuit 120C may be based upon a distance that the corresponding contact array is moved.

The contact array 112A may include a substrate 140A where mating contacts are arranged thereon. The flexible circuit 120C may be sandwiched between the substrate 140A and another substrate or stiffener 261, which may, in turn, be fastened to a panel 262 using, for example, screws or adhesives. The contact array 112A in FIG. 7 is an interposer, but the contact array 112A may take other forms in alternative embodiments. The substrate 140A may include conductive pathways (not shown) that are electrically coupled to the flexible circuit 120C. The panel 262 supports and holds the contact array 112A such that the contact array 112A is floatably attached to the header section 210 (only one header section 210 is shown in FIG. 7) via a plurality of springs 264. The springs 264 may facilitate maintaining an orientation of the contact array 112A in the retracted and engaged positions. The contact array 112A also includes an alignment feature 288 that projects away from the contact array 112A. Alternatively, the alignment feature 288 may be a hole configured to receive a projection.

The contact arrays 112A and 112G and the flexible circuits 120 of the circuit assembly 282 may be molded together into one unit. The contact array 112G may be an interposer that engages the flexible circuit 120C on one side of the interposer and engages the printed circuit 106A (FIG. 1) on the other side of the interposer. Mating contacts of the contact array 112G may include press-fit contacts or solder-ball contacts that affix or secure the contact array 112G to the printed circuit 106A to facilitate holding the electrical connector 110A thereto. Alternatively, other mating contacts may be used.

Also shown in FIG. 7, the coupling mechanism 204 includes a roll bar 266A that is coupled to and extends through the header section 210 parallel to the central axis 296. The roll bar 266A may have a separate bearing 269A attached thereto that is configured to rotate about the roll bar 266A. Alternatively, the bearing 269A may be integrally formed with the roll bar 266A such that the roll bar 266A rotates with the bearing 269A. The bearing 269A has a roll surface 267A that contacts a finger surface 233A of the cam finger 232A. In FIG. 6, the coupling mechanism 204 and the contact array 112A are in the retracted position. In the retracted position, the cam finger 232A extends longitudinally toward the side 240 and the finger surface 233A is shaped to at least partially conform to the shape of the roll surface 267A so that the axle 230 does not inadvertently rotate.

The contact array 112A may be moved between the retracted and engaged positions. When the axle 230 is rotated in a direction as indicated by the arrow $R_1$, the cam finger 232A pushes the roll bar 266A away from the axle 230 in the mating direction $A_1$. The header section 210, likewise, moves in the mating direction $A_1$ thereby moving the contact array 112A away from the axle 230 and toward the printed circuit 102. Although not shown, the coupling mechanism 204 may be biased (e.g., by a spring force) such that a force $F_{B1}$ biases the header section 210 and the roll bar 266A in a direction toward the axle 230. When the axle 230 is rotated in a direction opposite $R_1$, the biasing force $F_{B1}$ moves the header section 210 and the roll bar 266A toward the axle 230 and away from the printed circuit 102.

Figure 8:
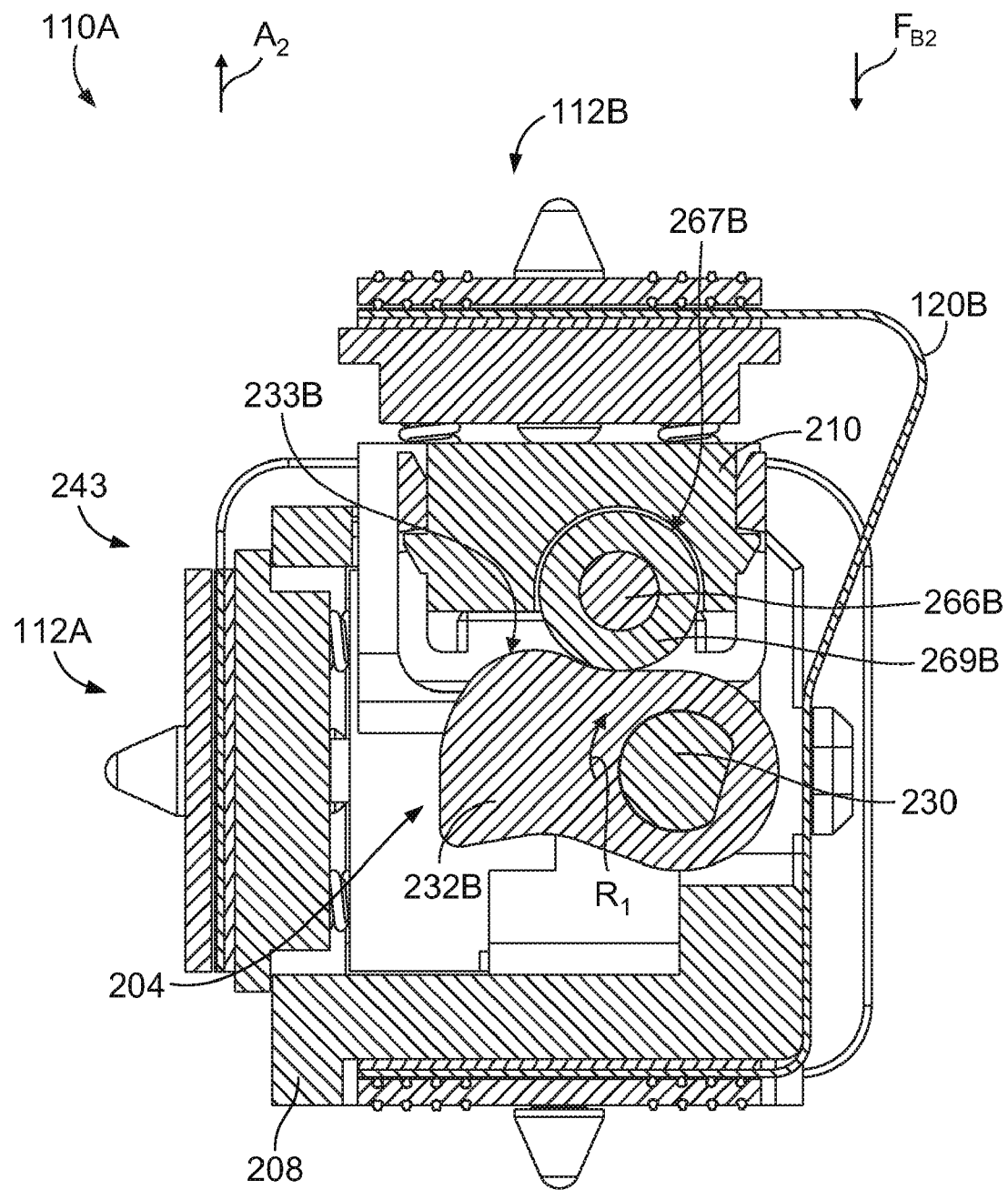
FIG. 8 is a cross-sectional view of the electrical connector taken along the line 8-8 in FIG. 6.

FIG. 8 is a cross-sectional view of the electrical connector 110A taken along the line 8-8 shown in FIG. 6. The coupling mechanism 204 may be configured to simultaneously operate on the contact arrays 112A and 112B. However, the contact array 112B may be configured to move between the retracted and engaged positions along a mating direction $A_2$ that is substantially orthogonal or perpendicular to the mating direction $A_1$ (FIG. 7). The coupling mechanism 204 is shown in the retracted position in FIG. 8. As shown, the cam finger 232B extends longitudinally toward the side 243. The cam finger 232B has a finger surface 233B that is sized and shaped to control movement of the contact array 112B. The finger surface 233B interfaces with a roll bar surface 267B of a bearing 269B of a roll bar 266B.

When the axle 230 is rotated in the direction indicated by the arrow $R_1$, the cam finger 232B pushes the roll bar 266B away from the axle 230 in the mating direction $A_2$. The corresponding header section 210, likewise, moves in the mating direction $A_2$ thereby moving the contact array 112B away from the axle 230 and toward the printed circuit 106B (FIG. 1). Again, the coupling mechanism 204 may be biased (e.g., by a spring force) such that a force $F_{B2}$ biases the header section 210 and the roll bar 266B in a direction toward the axle 230. When the axle 230 is rotated in a direction opposite $R_1$, the biasing force $F_{B2}$ moves the header section 210 and the roll bar 266B toward the axle 230 and away from the printed circuit 106B. The contact array 112B may also be floatable with respect to the base frame 208. In the embodiment shown in FIGS. 7 and 8, the cam fingers 232A and 232B operate simultaneously on different roll bars 266A and 266B, respectively, so that the contact arrays 112A and 112B move simultaneously in different mating directions $A_1$ and $A_2$, respectively. However, as will be described in greater detail below, the shape of the cam fingers 232A and 232B may be configured to sequence the movement of the contact arrays 112A and 112B in a desired manner.

Figures 9A, 9B, 9C:
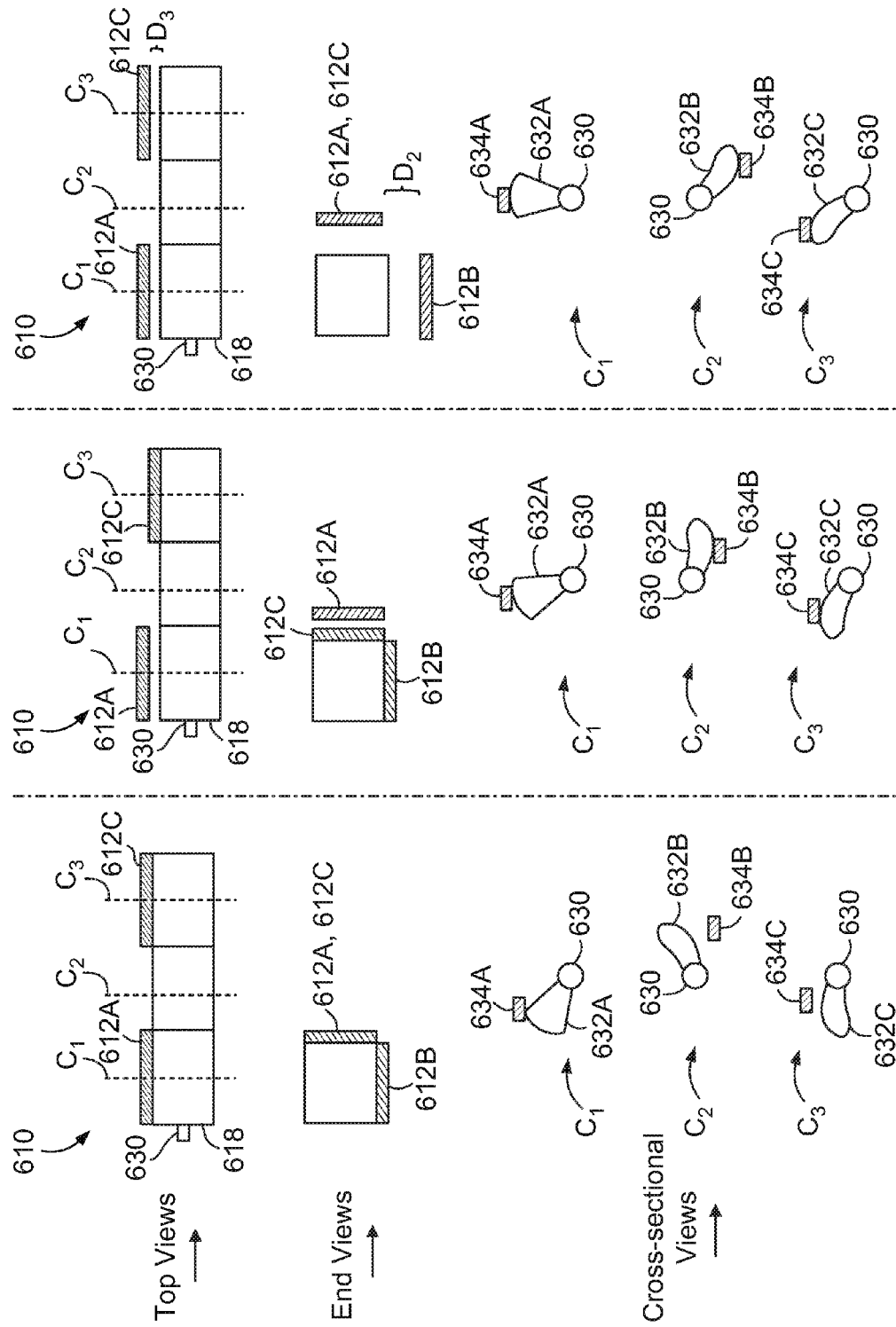
FIGS. 9A-C illustrate an electrical connector formed in accordance with another embodiment having contact arrays sequentially moved.

FIGS. 9A-C schematically show an electrical connector 610 formed in accordance with another embodiment at different stages 0-II of engaging a printed circuit (not shown). FIG. 9A corresponds to stage 0; FIG. 9B corresponds to stage I; and FIG. 9C corresponds to stage II. Each of FIGS. 9A-C shows a top plan view, an end view, and three cross-sectional views that illustrate an interaction between cam fingers 632 and contact array holders 634. Each cross-sectional view is taken along a corresponding plane $C_1$-$C_3$ as shown with respect to the top plan view.

Embodiments described herein may also include a plurality of contact arrays that are moved at different times. For example, the coupling mechanism may initiate movement of a first contact array from the corresponding retracted position toward the corresponding engaged position while a second contact array remains stationary. In particular embodiments, the contact arrays may be moved according to a predetermined sequence.

The electrical connector 610 includes contact arrays 612A-C held or supported by holders 634A-634C, respectively. The holders 634A-634C may include roll bars and header sections as described above. Although not shown, the electrical connector 610 may have a coupling mechanism, such as the coupling mechanism 204 (FIG. 4). The contact arrays 612A and 612C are located on a common side of the electrical connector 610, and the contact array 612B is located on a different, bottom side of the electrical connector 610. The electrical connector 610 may include a rotatable axle 630 that is operatively coupled to cam fingers 632A-C. The cam fingers 632A-632C may be differently sized and shaped so that the contact arrays 612A-612C may be moved at different times. Alternatively, the cam fingers 632A-632C may have a common size and shape, but may be differently oriented with respect to each other and the axle 630. In some embodiments, it may be desirable to electrically couple one contact array to a select printed circuit before the other contact arrays.

Stage 0 (shown in FIG. 9A) illustrates the arrangement of the cam fingers 632A-C before the axle 630 is rotated, stage I (FIG. 9B) illustrates the arrangement of the cam fingers 632A-C when the axle 630 is partially rotated, and stage II (FIG. 9C) illustrates the arrangement of the cam fingers 632A-C when the axle 630 is fully rotated. As shown in stage 0, the cam finger 632A is in slidable contact with the holder 634A, and the cam fingers 632B and 632C are spaced apart from the holders 634B and 634C, respectively. When the axle 630 is partially rotated, the coupling mechanism (not shown) initiates moving the contact array 612A while the contact arrays 612B and 612C remain stationary with respect to a base frame 618. Although the contact arrays 612B and 612C have not been moved in stage I, the cam fingers 632B and 632C are now coupled or engaged with the holders 634B and 634C, respectively.

When the axle 630 is rotated between stages I and II, the cam finger 632A may be sized and shaped so that the contact array 612A is not moved further outward, but instead maintains the distance away from the base frame 618. For example, a portion of the cam finger 632A may have an outer surface that engages the holder 634A. The outer surface may be shaped to have a constant radius from an axis of rotation of the axle 630 so that the holder 634A and, consequently, the contact array 612A maintains the distance away from the base frame 618. Also shown, the cam finger 632B moves the holder 634B thereby moving the contact array 612B away from the base frame 618. Likewise, the cam finger 632C moves the holder 634C thereby moving the contact array 612C away from the base frame 618. However, the cam fingers 632B and 632C may be sized and shaped to move the respective contact arrays 612B and 612C different distances $D_2$ and $D_3$, respectively, away from the base frame 618. Furthermore, the cam fingers 632A, 632B, and 632C may be sized and shaped to move the respective contact arrays 612A, 612B, and 612C at different speeds away from the base frame 618.

As such, the coupling mechanism may initiate moving different contact arrays at different times with respect to each other. For example, the coupling mechanism may initiate movement of the contact array 612A from the retracted position toward the engaged position while the contact arrays 612B and 612C remain stationary with respect to the base frame 618. Furthermore, the contact arrays 612A-612C may be moved according to a predetermined sequence.

FIGS. 10 and 11 illustrate an isolated perspective view and a cross-sectional perspective view, respectively, of a coupling mechanism 704 and a keying device 706 (FIG. 11) that may be used with various embodiments, such as the connectors 110A-110C (FIG. 1) and 610 (FIG. 9) described above. The coupling mechanism 704 may have similar features and components as described above with respect to the coupling mechanism 204 (FIG. 6). As shown, the coupling mechanism 704 is operatively coupled to the keying device 706 and may be supported by a base frame 708. The coupling mechanism includes a rotatable axle 730 having a longitudinal central axis 796 extending therethrough. The base frame 708 may include a plurality of axle supports 722 that support the axle 730.

The coupling mechanism 704 also includes a plurality of cam fingers 732 that are coupled to the axle 730 and project radially away from the axle 730 (or central axis 796). Also shown, the axle 730 has a rotatable end 731 that is configured to be engaged by a user or system for rotating the axle 730 about the central axis 796. The axle 730 and cam fingers 732 may operate similarly to the axle 230 and the cam fingers 232 described above with reference to FIGS. 6-8. For example, the axle 730 may be rotated about the central axis 796 to rotate the cam fingers 732. The cam fingers 732 may be sized and shaped to move moveable contact array(s) (not shown) away from the axle 730 or the central axis 796.

The keying device 706 is configured to selectively engage at least one contact array. More specifically, the keying device 706 is configured to engage select cam fingers 732 so that when the axle 730 is rotated, only the cam fingers 732 that are engaged by the keying device 706 will rotate with the axle 730. As such, when the coupling mechanism 704 is actuated (i.e., when the axle 730 is rotated about the central axis 796 by a user or system), the contact array(s) that are selectively engaged by the keying device 706 move between retracted and engaged positions.

To this end, the axle 730 may have a groove or channel 740 (FIG. 11) that extends along the central axis 796 between the rotatable end 731 and an opposite end 742. The keying device 706 may include a slidable rod 744 (FIG. 11) that is sized and shaped to fit within and slide along the channel 740 in an axial direction (i.e., in the direction of the central axis 796). The keying device 706 may also include a plurality of key projections 746 that project radially away from the slidable rod 744. The cam fingers 732 may include cavities 748 that are sized and shaped to receive the key projections 746. The key projections 746 are axially located along the slidable rod 744 to engage select cam fingers 732 when the slidable rod 744 is moved a predetermined axial distance along the axle 730.

Figure 12:
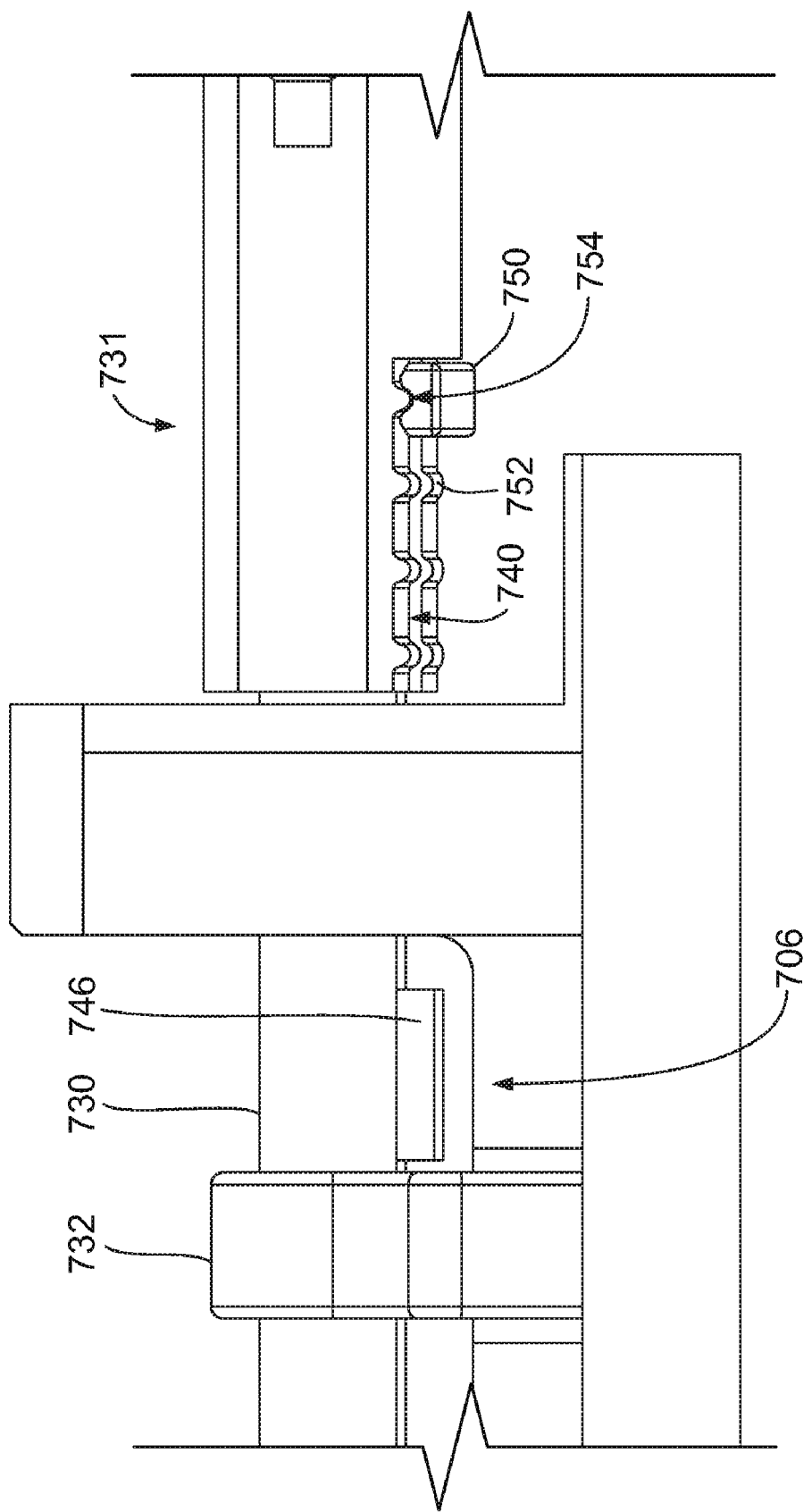
FIG. 12 is a side view of a rotatable end used with the coupling mechanism and keying device of FIG. 10.
Figure 13:
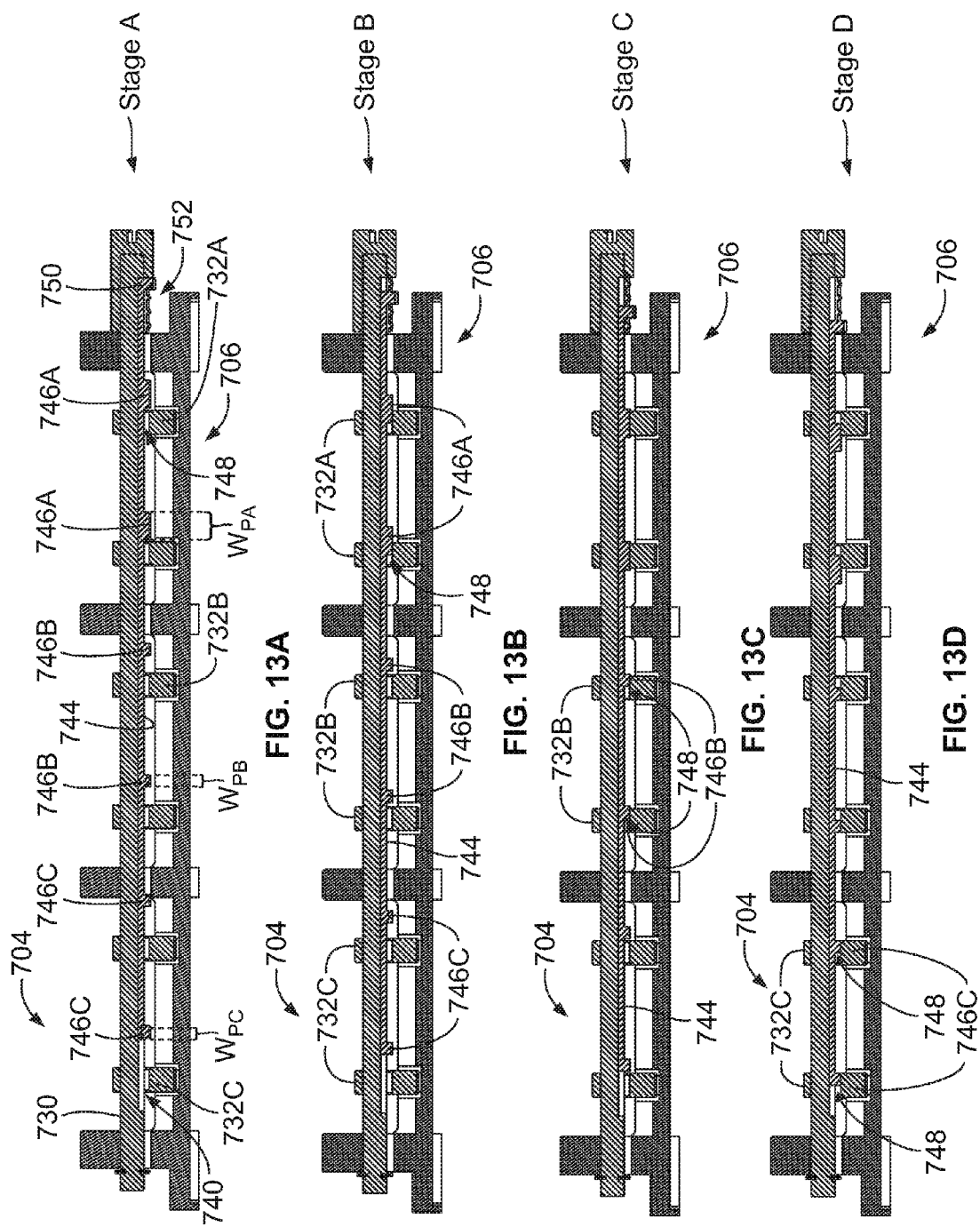
FIGS. 13A-D illustrate a series of cross-sectional views of the coupling mechanism and the keying device in different stages.

FIG. 12 is a side view of the rotatable end 731. As shown, the keying device 706 may include a latching feature 750 that is coupled to the slidable rod 744 (FIG. 11) and projects radially away therefrom. The latching feature 750 is accessible to the user or system. The latching feature 750 may be sized and shaped so that a user or system may engage the latching feature 750 and move the slidable rod 744 within the channel 740. The rotatable end 731 may include a series of ridges 752 located proximate to the channel 740 and configured to engage the latching feature 750. For example, the latching feature 750 may include a recess 754. The latching feature 750 may be moved in an axial direction to move the slidable rod 744 along the axle 730. As the latching feature 750 is moved axially, the latching feature 750 may engage the ridges 752. For example, each ridge 752 may deflect the latching feature 750 away from the axle 730 and form an interference fit with the recess 754. As such, the latching feature 750 and each ridge 752 may provide a tactile indication that the slidable rod 744 has moved a predetermined axial distance. As will be described in greater detail below, the ridges 752 may be spaced apart from each other to facilitate locating the key projections 746 within corresponding cavities 748 (FIG. 11) of the cam fingers 732.

FIGS. 13A-D illustrate a series of cross-sectional views of the coupling mechanism 704 and the keying device 706 in different Stages A-D. The key projections 746 facilitate coupling the axle 730 to the cam fingers 732 so that when the axle 730 is rotated, the cam fingers 732 move with the axle 730. If a corresponding key projection 746 is not located within a cavity 748 of a corresponding cam finger 732, then the corresponding cam finger 732 will not rotate with the axle 730. As such, the contact array that is configured to operatively engage the corresponding cam finger 732 will not be moved. Accordingly, the keying device 706 enables a user or system to move select contact arrays.

Each Stage A-D corresponds to a different predetermined axial position of the slidable rod 744 along the axle 730. Stage A is an unengaged stage where the keying device 706 is not selectively engaged with any of the cam fingers 732. As shown, the key projections 746 have different axial locations along the slidable rod 744. Each key projection 746 is axially located on the slidable rod 744 to be inserted into a corresponding cavity 748 of a select cam finger 732 when the slidable rod 744 is moved to a predetermined position. Furthermore, each key projection 746 has a different width $W_P$ that extends in the axial direction along the slidable rod 744. The key projections 746A have a width $W_{PA}$, the key projections 746B have a width $W_{PB}$, and the key projections 746C have a width $W_{PC}$. In the exemplary embodiment, the widths $W_P$ have different dimensions. However, in alternative embodiments, the widths $W_P$ and the axial locations of the key projections 746 may be adapted for a desired selective engagement sequence. For example, the width $W_{PB}$ may be greater than the width $W_{PA}$.

To move the slidable rod 744 between Stages A-D, a user or system may engage the latching feature 750 and move the slidable rod 744 within the channel 740 in an axial direction (i.e., in the direction of the central axis 796 (FIG. 10)). The ridges 752 may provide tactile indications with the latching feature 750 that the slidable rod 744 is located at a predetermined position along the axle 730. More specifically, each Stage A-D may correspond to the latching feature 750 being slidably engaged to a different corresponding ridge 752. In Stage B, the key projections 746A have been inserted at least partially into cavities 748 of the cam fingers 732A. However, the widths $W_{PB}$ and $W_{PC}$ of the key projections 746B and 746C, respectively, are sized such that the key projections 746B and 746C are not located within the cavities 748 of the cam fingers 732B and 732C, respectively. Accordingly, in Stage B, the keying device 706 is engaged with the moveable contact array (not shown) that is operatively coupled to the cam fingers 732A.

In Stage C, the key projections 746B have been inserted at least partially into cavities 748 of the cam fingers 732B, and the key projections 746A remain at least partially within the cavities 748 of the cam fingers 732A. However, the widths $W_{PC}$ of the key projections 746C are sized such that the key projections 746C are not located within the cavities 748 of the cam fingers 732C. Accordingly, in Stage C, the keying device 706 is engaged with the contact arrays that are operatively coupled to the cam fingers 732A and 732B.

In Stage D, the key projections 746C have been inserted at least partially into cavities 748 of the cam fingers 732C, and the key projections 746A and 746B remain at least partially within the cavities 748 of the cam fingers 732A and 732B, respectively. Accordingly, in Stage D, the keying device 706 is engaged with the contact arrays that are operatively coupled to the cam fingers 732A, 732B, and 732C. At any of the Stages B-D, the axle 730 may be rotated by a user or system to move the contact array(s) that is/are operatively coupled to the cam fingers 732. As such, the keying device 706 may facilitate selectively moving contact arrays of the embodiments described herein.

In alternative embodiments, the key projections 746 may be at least one of sized and axially located to engage the cam fingers 732 in a different sequence as described above. For example, the key projections 746C may be sized larger than the key projections 746A so that the cam fingers 732C are engaged before the cam fingers 732A. Furthermore, in other embodiments, the key projections 746 may be at least one of sized and axially located to slide entirely through a cavity 748 of a cam finger 732. As such, the key projection 746 may engage and then disengage with a cam finger 732 in one complete axial slide of the slidable rod 744. For example, the key projection 746A may be engaged with the cam finger 732A at Stage B, then slide entirely through the cavity 748 and be disengaged with the cam finger 732A at Stage D.

In alternative embodiments, the keying device 706 and the cam fingers 732 may be configured so that the contact arrays are moved at different times. For example, the cavities 748 in the cam fingers 732B may be sized and shaped such that the axle 730 must be rotated (e.g., 15°) before the key projections 746B engage interior walls of the cavity 748 to move the cam finger 732B. In another embodiment, the cavities 748 in the cam fingers 732B may be located such that the axle 730 must be rotated (e.g., 15°) in between Stages B and C to position the key projections 746B to be inserted into the cavities 748 of the cam fingers 732B. In such embodiments, other contact arrays may be moved before the contact array that is operatively coupled to the cam fingers 732B is moved.

FIG. 14 illustrates a perspective view of a coupling mechanism 804 and a keying device 806 that may be used with various embodiments, such as the connectors 110 (FIG. 1) and 610 (FIG. 9) described above. The coupling mechanism 804 may have similar features and components as described above with respect to the coupling mechanism 204 (FIG. 6). As shown, the coupling mechanism 804 is operatively coupled to the keying device 806 and may be supported by a base frame 808. The coupling mechanism includes a rotatable axle 830 having a longitudinal central axis 896 extending therethrough. The base frame 808 may include a plurality of axle supports 822 that support the axle 830 and the keying device 806.

The coupling mechanism 804 also includes a plurality of cam fingers 832 that are slidably coupled to the axle 830 and project radially away from the axle 830 (or central axis 896). Also shown, the axle 830 has a rotatable end 831 that is configured to be engaged by a user or system for rotating the axle 830 about the axis 896.

The keying device 806 is configured to selectively engage at least one moveable contact array (not shown). More specifically, the keying device 806 is configured to engage select cam fingers 832 so that when the axle 830 is rotated, only the cam fingers 832 that are engaged to the keying device 806 will rotate with the axle 830. As such, when the coupling mechanism 804 is actuated (i.e., when the axle 830 is rotated about the central axis 896 by a user or system), the contact array(s) that are selectively engaged by the keying device 806 move between retracted and engaged positions.

As shown, the keying device 806 includes an assembly of slidable rods 840-842 and key projections 850-852. The slidable rods 840-842 extend lengthwise alongside the axle 830 and the base frame 808. As shown, the slidable rod 840 is attached to the key projections 850, the slidable rod 841 is attached to the key projections 851, and the slidable rod 842 is attached to the key projections 852. Optionally, the slidable rods 840-842 are also supported by the axle supports 822. A user or system may selectively move the slidable rod(s) 840-842 to move the attached key projections 850-852.

The slidable rods 840-842 and the key projections 850-852 are configured to selectively engage the cam fingers 832A-832C to move the cam fingers 832A-832C along the axle 830. The keying device 806 also includes cam locks 862A-862C that are configured to engage the cam fingers 832A-832C when the cam fingers 832A-832C are moved by the keying device 806. The cam locks 862A-862C may facilitate rotating the cam fingers 832A-832C to move the corresponding contact arrays.

Figure 15:
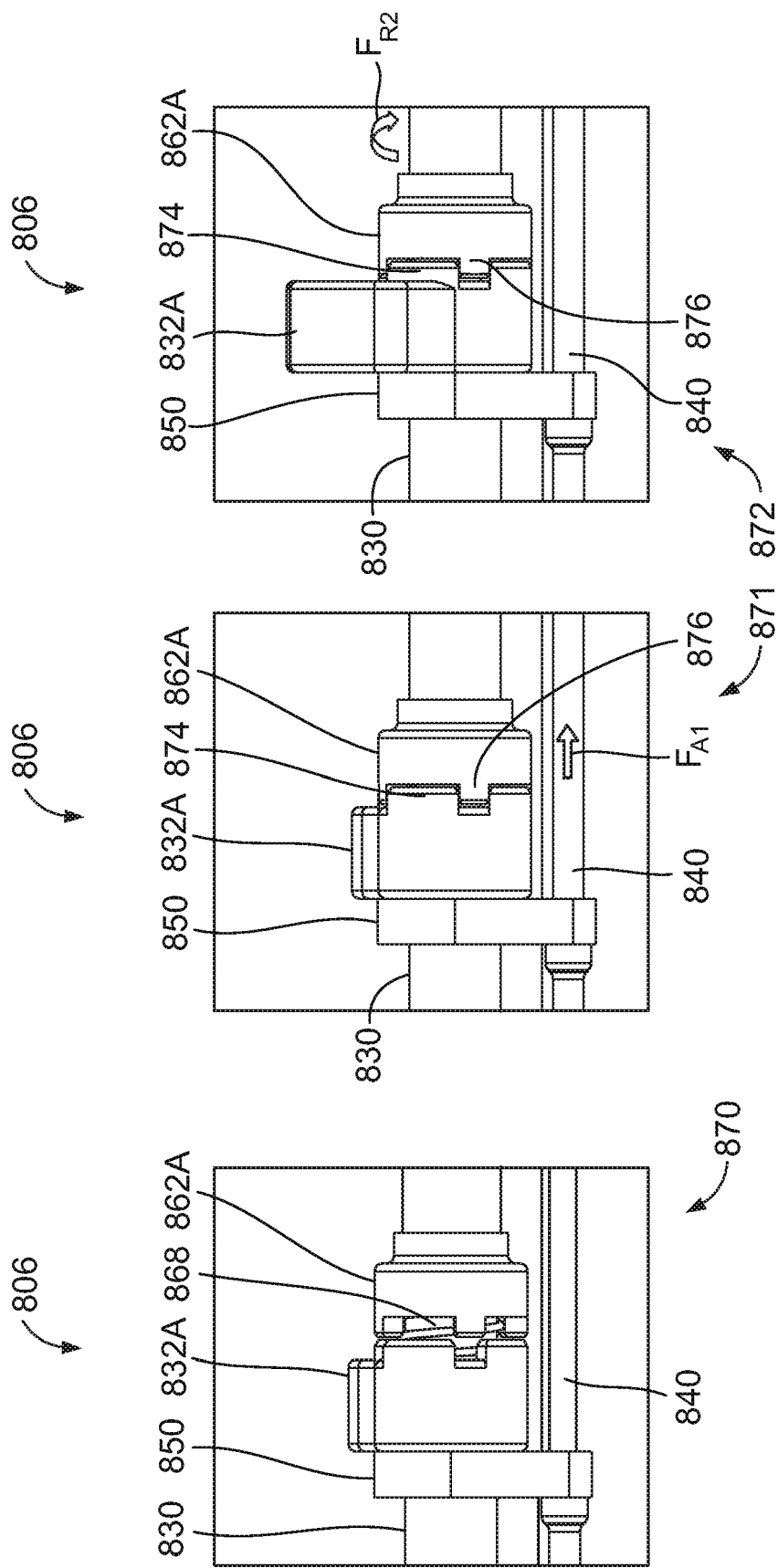
FIG. 15 illustrates a portion of the keying device shown in FIG. 14.

FIG. 15 illustrates a portion of the keying device 806 and, more specifically, an interaction between the slidable rod 840, the key projection 850, and the cam lock 862A for moving the cam finger 832A. Although the following description is with particular reference to the cam finger 832A, a similar interaction may occur to selectively engage the cam fingers 832B and 832C (FIG. 14). As shown in FIG. 15, the cam finger 832A may be moved into various positions 870-872. In the unengaged position 870, the cam finger 832A is spaced apart from the cam lock 862A and engaged with the key projection 850. Optionally, the keying device 806 may include a resilient spring 868 that provides a separation force to separate the cam finger 832A and the cam lock 862A.

The cam lock 862A may be affixed to the axle 830. To move the cam finger 832A to the engaged position 871, a user or system may provide an axial force $F_{A1}$ to move the slidable rod 840 along the central axis 896 (FIG. 14) toward the cam lock 862A. The key projection 850 may slide along the axle 830 and engage the cam finger 832A. The key projection 850 may then move the cam finger 832A toward the cam lock 862A thereby compressing the resilient spring 868 between the cam finger 832A and the cam lock 862A.

As shown, the cam finger 832A and the cam lock 862A may have complementary ridges and teeth 874 and 876, respectively, that engage each other to interlock the cam finger 832A and the cam lock 862A. With the cam finger 832A and the cam lock 862A engaged with each other, the user or system may provide a rotational force $F_{R2}$ to rotate the axle 830 about the central axis 896. The teeth 874 and 876 facilitate rotating the cam finger 832A about the central axis 896 thereby moving the contact array (not shown) that is operatively coupled to the cam finger 832A. When the user or system releases the slidable rod 840, the potential energy of the spring 868 may separate the cam finger 832A and the cam lock 862A. The axle 830 may remain in a rotational position or orientation when the slidable rod 840 is released.

In alternative embodiments, the keying device 806 does not include the spring 868. For example, in such embodiments, the key projection 850 may be attached to the cam finger 832A. The user or system may provide an axial force in an opposite direction of the axial force $F_{A1}$ to separate the cam finger 832A and the cam lock 862A.

Although the illustrated embodiments are described with reference to electrically interconnecting printed circuits and, more specifically, circuit boards, the description herein is not intended to be limited to printed circuits or circuit boards. Embodiments described herein may also be used to interconnect other electrical components where an electrical component has an array of mating contacts that complement or are configured to engage the mating contacts of a moveable contact array, such as other flexible circuits.

Furthermore, although the illustrated embodiments are described with reference to electrical connections, embodiments described herein may be similarly configured to establish optical connections.

It is to be understood that the above description is intended to be illustrative, and not restrictive. As such, other connectors and coupling mechanisms may be made as described herein that couple a moveable mating array to another array of terminals. For example, the connectors and coupling mechanisms may be like the electrical connectors and coupling mechanisms described in U.S. patent application Ser. Nos. 12/428,806 and 12/428,851 and also a U.S. patent application Ser. No. 12/686,518, all of which are incorporated by reference in the entirety.

In addition, the above-described embodiments (and/or aspects or features thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector configured to communicatively couple different components, the connector comprising:
a base frame extending along a longitudinal axis between a pair of frame ends;
moveable first and second mating arrays comprising respective mating surfaces having terminals arranged thereon; and
a coupling mechanism supported by the base frame, the coupling mechanism holding the first and second mating arrays and moving the first and second mating arrays between retracted and engaged positions, the first and second mating arrays being spaced apart from a select component when in the corresponding retracted position, the first and second mating arrays being communicatively coupled to the select component when in the corresponding engaged position, wherein the first and second mating arrays are moved with respect to the base frame at different times by the coupling mechanism, the coupling mechanism configured to drive the first and second mating arrays either at least partially away from each other to the corresponding engaged positions or in a same direction to the corresponding engaged positions.

2. The connector in accordance with claim 1 wherein the coupling mechanism drives the first and second mating arrays according to a predetermined sequence.

3. The connector in accordance with claim 1 further comprising a keying device that is operatively connected to the coupling mechanism, the keying device selectively engaging at least one of the first and second mating arrays to move between the corresponding retracted and engaged positions.

4. The connector in accordance with claim 1 wherein the coupling mechanism moves the first and second mating arrays in different mating directions between the corresponding retracted and engaged positions.

5. The connector in accordance with claim 1 wherein the coupling mechanism moves at least one of the first and second mating arrays in a linear manner between the corresponding retracted and engaged positions.

6. The connector in accordance with claim 1 wherein the coupling mechanism includes an axle extending along a central axis and supported by the base frame and also includes a plurality of cam fingers that are coupled to and extend radially away from the central axis, the cam fingers being configured to move the first and second mating arrays at different times, the first and second mating arrays moving away from the axle when the axle is rotated about the central axis.

7. The connector in accordance with claim 1 wherein the coupling mechanism moves the first and second mating arrays at different speeds between the corresponding retracted and engaged positions.

8. The connector in accordance with claim 1 wherein the first and second mating arrays move different distances between the corresponding retracted and engaged positions.

9. The connector in accordance with claim 1 wherein at least one of the first and second mating arrays includes an alignment feature configured to align the terminals of the corresponding mating array with terminals of the select component.

10. The connector in accordance with claim 1 wherein the mating surfaces of the first and second mating arrays are oriented perpendicular to each other.

11. The connector in accordance with claim 1 wherein at least one of the first and second mating arrays is floatable with respect to the base frame.

12. The connector in accordance with claim 1, wherein the coupling mechanism includes an elongated operator-controlled actuator having an axis that extends through the actuator and along a longest dimension of the actuator, the actuator configured to drive the first and second mating arrays away from the axis to the engaged positions.

13. The connector in accordance with claim 1, wherein the coupling mechanism includes an operator-controlled actuator that is movable between first and second operative positions, the actuator driving the first and second mating arrays different times when the actuator is moved from the first operative position to the second operative position.

14. The connector in accordance with claim 13, wherein the actuator is rotatable and the first and second operative positions are different rotational positions.

15. The connector in accordance with claim 1, further comprising first and second flex connections communicatively coupled to the first and second mating arrays, respectively, each of the first and second flex connections comprising at least one of a flexible circuit or an optical cable, wherein the first and second flex connections extend lengthwise between respective first and second ends and wherein, for each of the first and second flex connections, a distance between the first end and the associated second end increases as the respective mating array is moved toward the corresponding engaged position.

16. The connector in accordance with claim 1, wherein the first mating array is maintained in the engaged position of the first mating array while the second mating array is moving toward the engaged position of the second mating array.

17. The connector in accordance with claim 1, wherein the first and second mating arrays move for non-overlapping time periods.

18. A connector configured to communicatively couple different components, the connector comprising:
a base frame extending along a longitudinal axis between a pair of frame ends;
moveable first and second mating arrays comprising respective mating surfaces having terminals arranged thereon;
a coupling mechanism supported by the base frame, the coupling mechanism holding the first and second mating arrays and moving the first and second mating arrays between retracted and engaged positions, the first and second mating arrays being spaced apart from a select component when in the corresponding retracted position, the first and second mating arrays being communicatively coupled to the select component when in the corresponding engaged position, wherein the first and second mating arrays move with respect to the base frame at different times during activation of the coupling mechanism; and
a third mating array that faces in a different direction relative to the first and second mating arrays, each of the first and second mating arrays being communicatively coupled to the third mating array.

19. The connector in accordance with claim 1, further comprising a third mating array configured to be moved by the coupling mechanism between corresponding retracted and engaged positions, the third mating array moving at a different time relative to at least one of the first mating array or the second mating array.

20. The connector in accordance with claim 1, wherein the first and second mating arrays move in the same direction when the first and second mating arrays are moved to the corresponding engaged positions.

* * * * *